(12) United States Patent
Lee et al.

(10) Patent No.: US 10,453,834 B2
(45) Date of Patent: Oct. 22, 2019

(54) DISPLAY DEVICE WITH ELECTROSTATIC DISPERSION LINE

(71) Applicant: SAMSUNG DISPLAY CO., LTD., Yongin-si, Gyeonggi-do (KR)

(72) Inventors: Changsoo Lee, Suwon-si (KR); Kookhyun Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 25 days.

(21) Appl. No.: 15/836,090

(22) Filed: Dec. 8, 2017

(65) Prior Publication Data

US 2018/0166435 A1 Jun. 14, 2018

(30) Foreign Application Priority Data

Dec. 9, 2016 (KR) .................. 10-2016-0167767

(51) Int. Cl.
*H01L 27/02* (2006.01)
*G02F 1/1345* (2006.01)
(Continued)

(52) U.S. Cl.
CPC ........ *H01L 27/0248* (2013.01); *G02F 1/1345* (2013.01); *G02F 1/136204* (2013.01);
(Continued)

(58) Field of Classification Search
CPC ............ H01L 27/3272; H01L 27/3288; H01L 27/3276; H01L 27/0248; H01L 27/0292;
(Continued)

(56) References Cited

U.S. PATENT DOCUMENTS 5,798,534 A * 8/1998 Young ................. H01L 27/1237
257/59
6,072,550 A * 6/2000 Kim .................. G02F 1/136204
349/139
(Continued)

FOREIGN PATENT DOCUMENTS

KR 100166894 B1 9/1998
KR 1008097130000 B1 2/2008

OTHER PUBLICATIONS

US 5,767,928 A, 06/1998, Ha (withdrawn)

*Primary Examiner* — Darlene M Ritchie
(74) *Attorney, Agent, or Firm* — Cantor Colburn LLP

(57) ABSTRACT

A display device includes: a first substrate including display and non-display areas; gate and data lines on the first substrate and crossing each other; an electrostatic dispersion line on the non-display area; an antistatic element including an discharge gate electrode, a discharge semiconductor layer on the discharge gate electrode and overlapping at least a portion of the discharge gate electrode, and a discharge source and drain electrodes a on the discharge semiconductor layer, spaced apart from each other and overlapping at least a portion of the discharge gate electrode; and an electric field protection layer on the antistatic element and overlapping the discharge gate electrode. One of the discharge source and drain electrodes is connected to the electrostatic dispersion line and the other of the discharge source and drain electrodes is connected to one of the gate line and the data line.

19 Claims, 12 Drawing Sheets

(51) Int. Cl.
*G02F 1/1362* (2006.01)
*H01L 27/12* (2006.01)
*G09G 3/36* (2006.01)

(52) U.S. Cl.
CPC ..... *G02F 1/136286* (2013.01); *G09G 3/3648* (2013.01); *H01L 27/0292* (2013.01); *G02F 2001/136218* (2013.01); *G02F 2202/22* (2013.01); *G09G 2330/06* (2013.01); *H01L 27/124* (2013.01)

(58) Field of Classification Search
CPC ....... H01L 27/32; H01L 27/124; H01L 23/60; G02F 1/136286; G02F 1/136204; G02F 1/1345; G02F 2202/22; G02F 2001/136218; G02F 2001/136204; G06F 3/044; G06F 3/0412; G06F 3/0416; G06F 3/0418; G06F 2203/04107; G06F 2203/04103; G09G 2300/0426; G09G 3/3677; G09G 3/3674; G09G 3/006; G09G 3/3275; G09G 3/3685; G09G 2330/04; G09G 2330/06; G09G 2310/0232; G09G 3/3648
See application file for complete search history.

(56) References Cited

U.S. PATENT DOCUMENTS

| | | | | |
|---|---|---|---|---|
| 7,158,195 B2 * | 1/2007 | Chang | ............... | G02F 1/136204 257/E27.111 |
| 7,358,536 B2 | 4/2008 | Lai | | |
| 7,864,254 B2 * | 1/2011 | Kim | ................. | G02F 1/136204 257/347 |
| 8,049,249 B1 * | 11/2011 | Cheng | ..................... | H01L 23/60 257/173 |
| 8,637,867 B2 * | 1/2014 | Choi | ................... | H01L 27/0296 257/59 |
| 2002/0009890 A1 * | 1/2002 | Hayase | ............. | G02F 1/136204 438/706 |
| 2006/0017681 A1 * | 1/2006 | Jang | ...................... | H01L 27/124 345/98 |
| 2006/0278929 A1 | 12/2006 | Liu et al. | | |
| 2007/0273802 A1 * | 11/2007 | Nakamura | ......... | G02F 1/136204 349/40 |
| 2009/0026932 A1 * | 1/2009 | Kwak | ................. | H01L 27/3272 313/504 |
| 2009/0102995 A1 * | 4/2009 | Kim | .................... | H01L 27/0248 349/40 |
| 2009/0310051 A1 * | 12/2009 | Kim | .................. | G02F 1/136204 349/40 |
| 2011/0234568 A1 * | 9/2011 | Izumida | ............... | H01L 27/0288 345/211 |
| 2011/0255653 A1 * | 10/2011 | Chae | ...................... | G09G 3/3677 377/79 |
| 2012/0119979 A1 * | 5/2012 | Nakayasu | ............ | G09G 3/3648 345/30 |
| 2014/0152943 A1 * | 6/2014 | Dorjgotov | .............. | H05B 33/22 349/96 |
| 2015/0015800 A1 * | 1/2015 | Yang | ...................... | G06F 3/0416 349/12 |
| 2015/0241744 A1 * | 8/2015 | Nakata | ................. | H01L 27/0296 349/42 |
| 2015/0379923 A1 * | 12/2015 | Lee | ...................... | G09G 3/3233 345/206 |
| 2016/0026045 A1 * | 1/2016 | Inamura | ............ | G02F 1/136204 349/12 |
| 2016/0163780 A1 * | 6/2016 | Park | ...................... | H01L 27/3248 257/40 |
| 2017/0025441 A1 * | 1/2017 | Mori | ..................... | G02F 1/1368 |
| 2017/0154944 A1 * | 6/2017 | Kim | ................... | H01L 27/3225 |
| 2017/0300166 A1 * | 10/2017 | Rosenberg | ............ | G06F 3/045 |
| 2017/0352312 A1 * | 12/2017 | Ebisuno | ................... | G09G 3/20 |

* cited by examiner

DISPLAY DEVICE WITH ELECTROSTATIC DISPERSION LINE

This application claims priority to Korean Patent Application No. 10-2016-0167767, filed on Dec. 9, 2016, and all the benefits accruing therefrom under 35 U.S.C. § 119, the content of which in its entirety is herein incorporated by reference.

BACKGROUND

1. Field

Embodiments of the invention relate to a display device, and more particularly, to a display device in which an element is effectively prevented from being damaged by static electricity.

2. Discussion of Related Art

Display devices may be classified into a liquid crystal display ("LCD") device, an organic light emitting diode ("OLED") display device, a plasma display panel ("PDP") device, an electrophoretic display device and the like based on a light emitting scheme thereof.

Among the display device, the LCD device is one of most widely used types of flat panel display ("FPD") device. An LCD device typically includes two substrates including electrodes provided thereon and a liquid crystal layer interposed therebetween. In such an LCD, liquid crystal molecules of the liquid crystal layer are rearranged upon applying a voltage to the two electrodes such that an amount of transmitted light is controlled in the LCD device.

Static electricity may be induced to the substrate of the display device, and a display element may be damaged when the induced static electricity is introduced into a display panel.

SUMMARY

Embodiments of the invention may be directed to a display device in which a display element thereof is effectively prevented from being damaged by static electricity.

According to an exemplary embodiment, a display device includes: a first substrate including a display area and a non-display area; a gate line extending along a first direction on the first substrate; a data line extending along a second direction crossing the first direction on the first substrate; an electrostatic dispersion line on the non-display area of the first substrate; an antistatic element connected to the electrostatic dispersion line and an electric field protection layer on the antistatic element. In such an embodiment, the antistatic element includes an discharge gate electrode, a discharge semiconductor layer on the discharge gate electrode, where the discharge semiconductor overlaps at least a portion of the discharge gate electrode on the discharge gate electrode, a discharge source electrode on the discharge semiconductor layer, where the discharge source electrode overlaps at least a portion of the discharge gate electrode, and a discharge drain electrode on the discharge semiconductor layer and spaced apart from the discharge source electrode, wherein the discharge drain electrode overlaps at least a portion of the discharge gate electrode. In such an embodiment, the electric field protection layer overlaps the discharge gate electrode, one of the discharge source electrode and the discharge drain electrode is connected to the electrostatic dispersion line, and the other of the discharge source electrode and the discharge drain electrode is connected to one of the gate line and the data line.

In an exemplary embodiment, the electric field protection layer may have a planar area larger than a planar area of the discharge gate electrode, and the electric field protection layer covers the discharge gate electrode.

In an exemplary embodiment, the electric field protection layer may include a conductive material.

In an exemplary embodiment, the electric field protection layer may have an electric potential substantially equal to an electric potential of the electrostatic dispersion line.

In an exemplary embodiment, the electrostatic dispersion line may extend along the first direction or the second direction.

In an exemplary embodiment, the electrostatic dispersion line may have a closed loop shape surrounding the display area.

In an exemplary embodiment, the discharge gate electrode may have a width less than a width of the discharge source electrode and the discharge drain electrode.

In an exemplary embodiment, an entire portion of the discharge gate electrode may overlap at least one of the discharge semiconductor layer, the discharge source electrode and the discharge drain electrode on a plane.

In an exemplary embodiment, an overlapping area of the discharge gate electrode and the discharge source electrode and an overlapping area of the discharge gate electrode and the discharge drain electrode may have different planar areas from each other.

In an exemplary embodiment, the display device may further include: a first capacitor defined by the overlapping area of the discharge gate electrode and the discharge source electrode; and a second capacitor defined by the overlapping area of the discharge gate electrode and the discharge drain electrode. In such an embodiment, the first capacitor may have a capacitance value different from a capacitance value of the second capacitor.

In an exemplary embodiment, the discharge source electrode and the discharge drain electrode may include a substantially same conductive material.

According to an exemplary embodiment, a display device includes: a first substrate including a display area and a non-display area; a gate line extending along a first direction on the first substrate; a data line extending along a second direction crossing the first direction on the first substrate; an electrostatic dispersion line on the non-display area of the first substrate; and an antistatic element connected to the electrostatic dispersion line, where the antistatic element includes an discharge gate electrode, a discharge semiconductor layer on the discharge gate electrode, where the discharge semiconductor layer overlaps at least a portion of the discharge gate electrode, a discharge source electrode on the discharge semiconductor layer, where the discharge source electrode overlaps at least a portion of the discharge gate electrode, and a discharge drain electrode on the discharge semiconductor layer and spaced apart from the discharge source electrode, where the discharge drain electrode overlaps at least a portion of the discharge gate electrode. In such an embodiment, one of the discharge source electrode and the discharge drain electrode is connected to the electrostatic dispersion line, the other of the discharge source electrode and the discharge drain electrode is connected to one of the gate line and the data line, and the discharge gate electrode has a width less than a width of the discharge source electrode and the discharge drain electrode.

In an exemplary embodiment, an entire portion of the discharge gate electrode may overlap at least one of the discharge semiconductor layer, the discharge source electrode and the discharge drain electrode on a plane.

In an exemplary embodiment, the discharge source electrode and the discharge drain electrode may include a substantially same conductive material.

In an exemplary embodiment, an overlapping area of the discharge gate electrode and the discharge source electrode and an overlapping area of the discharge gate electrode overlaps the discharge drain electrode may have different planar areas from each other.

In an exemplary embodiment, the display device may further include: a first capacitor defined by the overlapping area of the discharge gate electrode and the discharge source electrode; and a second capacitor defined by the overlapping area of the discharge gate electrode and the discharge drain electrode. In such an embodiment, the first capacitor may have a capacitance value different from a capacitance value of the second capacitor.

In an exemplary embodiment, the electrostatic dispersion line may extend along the first direction or the second direction.

In an exemplary embodiment, the electrostatic dispersion line may have a closed loop shape surrounding the display area.

In an exemplary embodiment, the antistatic element may be provided in plural, one of the discharge source electrode and the discharge drain electrode of one of the antistatic elements may be connected to the electrostatic dispersion line, the other of the discharge source electrode and the discharge drain electrode of the one of the antistatic elements may be connected to the gate line, one of the discharge source electrode and the discharge drain electrode of another of the antistatic elements may be connected to the electrostatic dispersion line, and the other of the discharge source electrode and the discharge drain electrode of the another of the antistatic elements may be connected to the data line.

In an exemplary embodiment, the electrostatic dispersion line may have an electric potential substantially equal to a ground potential.

In an exemplary embodiments of the invention, the antistatic element may disperse a static electricity introduced into the gate line, the data line and the electrostatic dispersion line in two opposite directions of the antistatic element, such that damages to a display element due to the static electricity is effective prevented.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
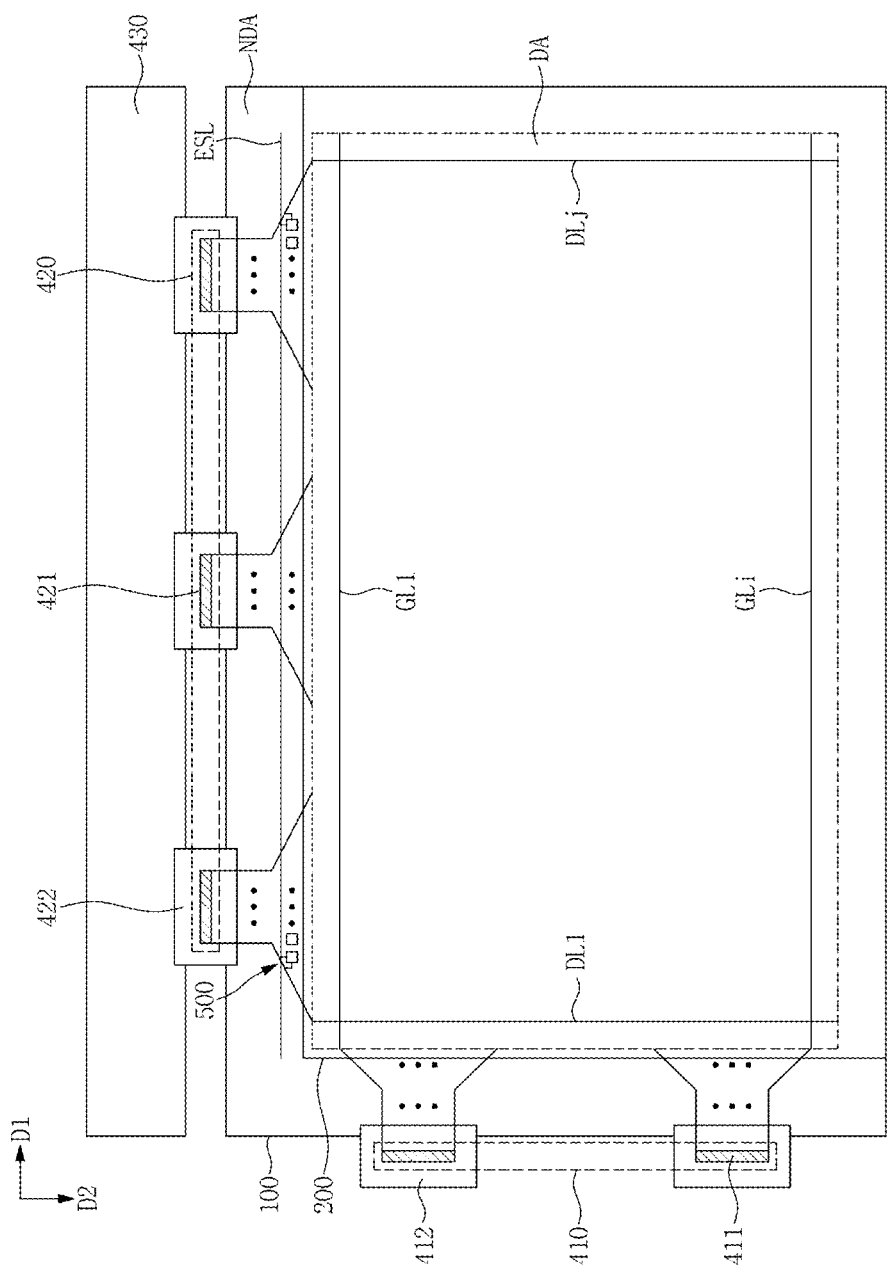
FIG. 1 is a view illustrating a display panel and a peripheral circuit connected thereto according to an exemplary embodiment.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be therebetween. Conversely, when a layer, area, or plate is referred to as being "directly below" another layer, area, or plate, intervening layers, areas, or plates may be absent therebetween. When an element is referred to as being "connected" to another element, the element is "directly connected" to the other element, or "electrically connected" to the other element with one or more intervening elements interposed therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Some of the parts which are not associated with the description may not be provided in order to specifically describe embodiments of the invention and like reference numerals refer to like elements throughout the specification.

Hereinafter, exemplary embodiments of the invention will be described in detail with reference to the accompanying drawings.

Figure 2A:
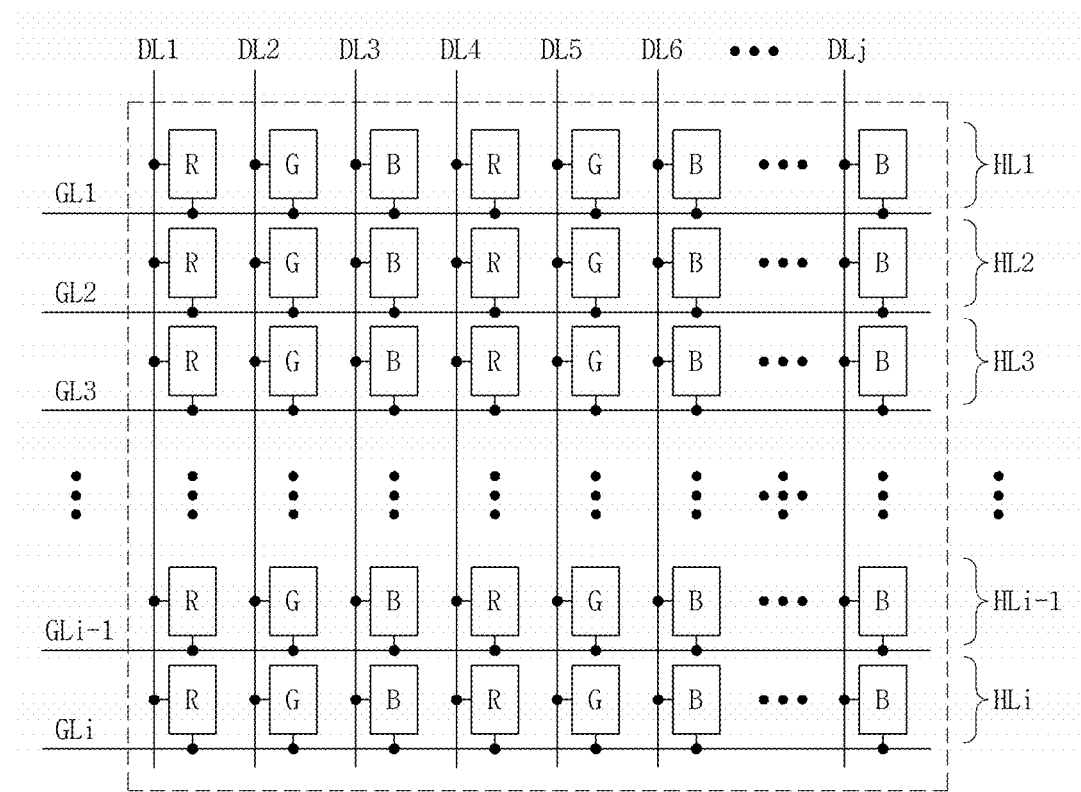
FIG. 2A is a view schematically illustrating pixels included in the display panel of FIG. 1.
Figure 2B:
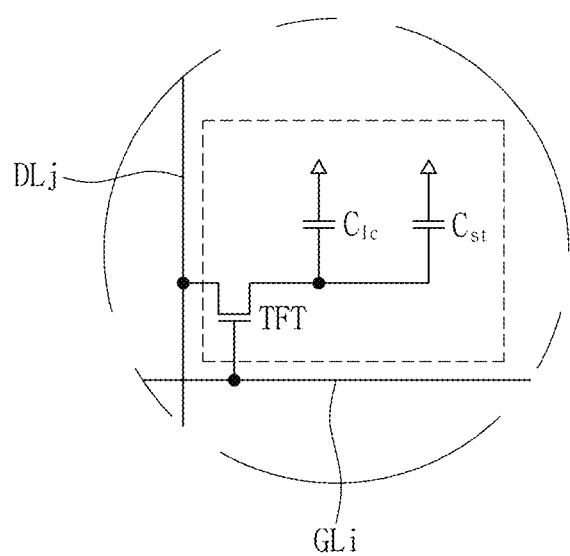
FIG. 2B is an enlarged view of the encircled portion of FIG. 2A.
Figure 3:
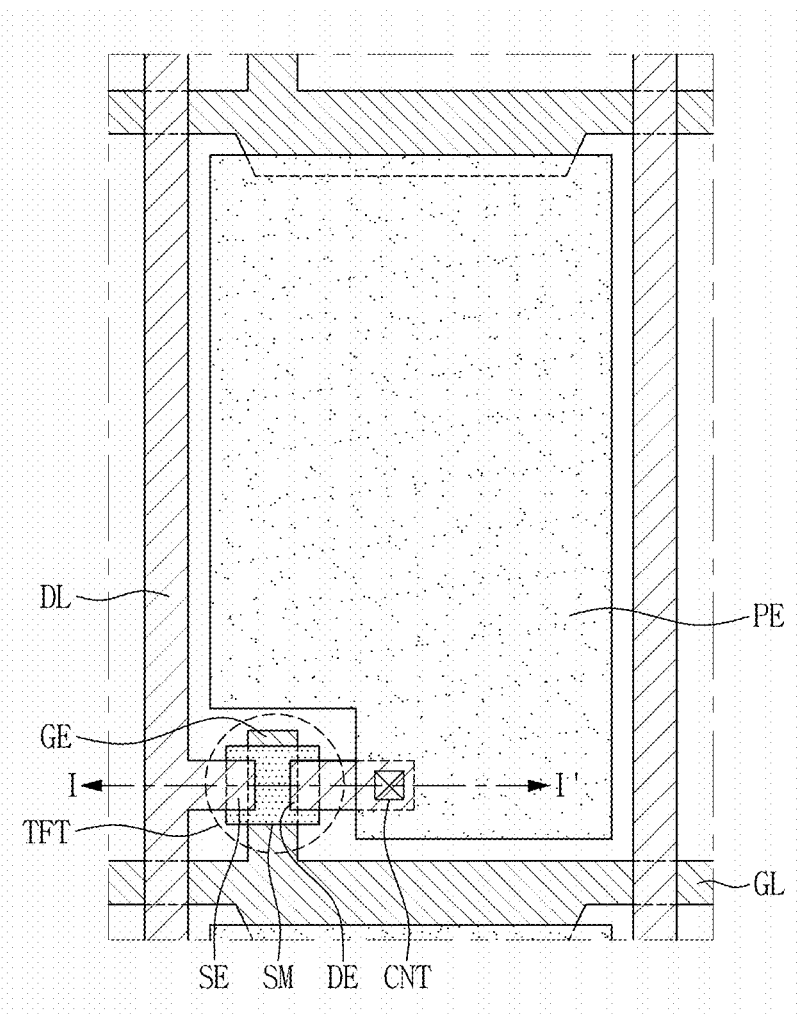
FIG. 3 is a plan view illustrating a pixel included in the display panel of FIG. 1.
Figure 4:
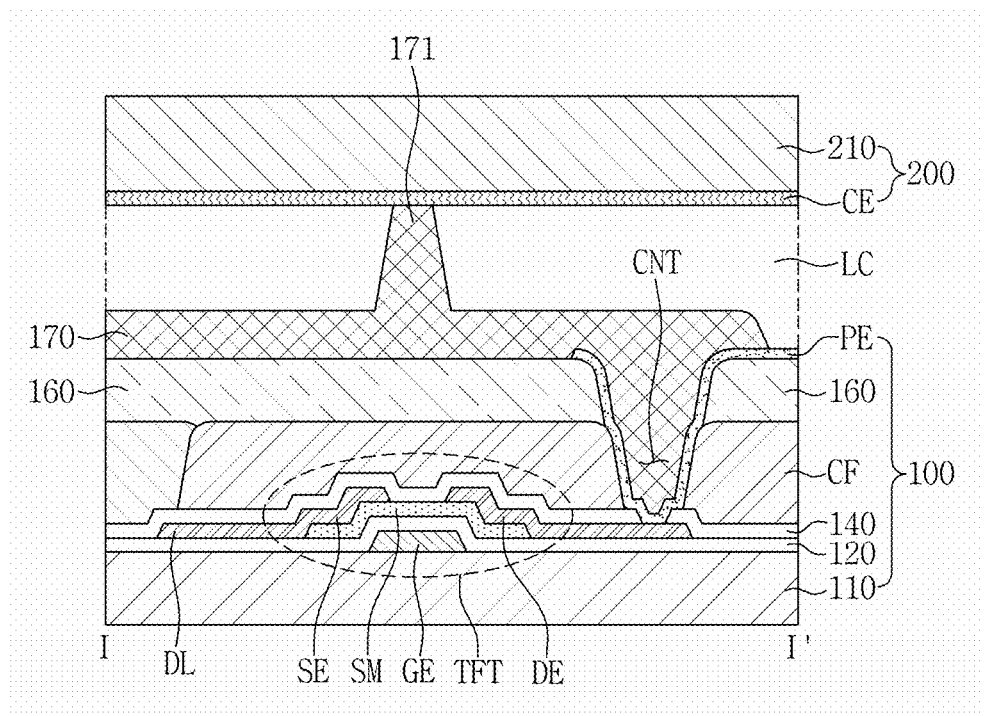
FIG. 4 is a cross-sectional view taken along line I-I' of FIG. 3.

FIG. 1 is a view illustrating a display panel and a peripheral circuit connected thereto according to an exemplary embodiment, FIG. 2A is a view schematically illustrating pixels included in the display panel of FIG. 1, FIG. 2B is an enlarged view the encircled portion of FIG. 2A, FIG. 3 is a plan view illustrating a pixel included in the display panel of FIG. 1, and FIG. 4 is a cross-sectional view taken along line I-I' of FIG. 3.

In an exemplary embodiment, a display device is a liquid crystal display ("LCD") device. In such an embodiment, the LCD device includes a display panel, a gate driver 410 and a data driver 420.

The display panel includes a lower panel 100, an upper panel 200 and a liquid crystal layer LC. The display panel is divided into a display area DA and a non-display area NDA.

The display area DA of the display panel corresponds to a display area DA of the lower panel 100 and a display area DA of the upper panel 200. The non-display area NDA of the display panel corresponds to a non-display area NDA of the lower panel 100 and a non-display area NDA of the upper panel 200.

The liquid crystal layer LC is disposed between the lower panel 100 and the upper panel 200. The liquid crystal layer LC may include liquid crystal molecules having negative dielectric anisotropy and aligned vertically. Alternatively, the liquid crystal layer LC may include a photopolymerizable material, and such a photopolymerizable material may be a reactive monomer or a reactive mesogen, for example.

In an exemplary embodiment, as illustrated in FIG. 1, the lower panel 100 has a planar area larger than a planar area of the upper panel 200. Herein, the term "planar area" is defined as an area when viewed from a plan view in a thickness direction of the lower panel 100. The lower panel 100 and the upper panel 200 face each other with the liquid crystal layer LC therebetween.

In an exemplary embodiment, as illustrated in FIGS. 1 and 4, the lower panel 100 includes a lower substrate 110, a plurality of gate lines GL1 to GLi, a plurality of data lines DL1 to DLj, an electrostatic dispersion line ESL, and an antistatic element 500. The electrostatic dispersion line ESL and the antistatic element 500 will be described below in detail with reference to FIGS. 5, 6A, 6B, and 6C.

The gate lines GL1 to GLi extend along a first direction D1, as illustrated in FIG. 1. The data lines DL1 to DLj extend along a second direction D2 which crosses the first direction D1, to cross the gate lines GL1 to GLi. The gate lines GL1 to GLi extend to the non-display area NDA to be connected to the gate driver 410, and the data lines DL1 to DLj extend to the non-display area NDA to be connected to the data driver 420.

The gate driver 410 includes a plurality of gate driving integrated circuits ("IC"s) 411. The gate driving ICs 411 generate gate signals and sequentially apply the gate signals to first to i-th gate lines GL1 to GLi.

The respective gate driving ICs 411 are disposed or mounted on gate carriers 412, respectively. The gate carriers 412 are electrically connected to the lower panel 100. In one exemplary embodiment, for example, each of the gate carriers 412 may be electrically connected between a circuit board 430 and the non-display area NDA of the lower substrate 110.

The data driver 420 includes a plurality of data driving ICs 421. The data driving ICs 421 receive digital image data signals and a data control signal from a timing controller. The data driving ICs 421 may sample the digital image data signals based on the data control signal, latch the sampled image data signals corresponding to one horizontal line in each horizontal period, and apply the latched image data signals to the data lines DL1 to DLj. In an exemplary embodiment, the data driving ICs 421 convert the digital image data signals applied from the timing controller into analog image signals using a gamma voltage input from a power supply portion (not illustrated), and apply the converted analog image signals to the data lines DL1 to DLj.

The respective data driving ICs 421 are disposed or mounted on data carriers 422. The data carriers 422 are connected between the circuit board 430 and the lower panel 100. In one exemplary embodiment, for example, each of the data carriers 422 may be electrically connected between the circuit board 430 and the non-display area NDA of the lower substrate 110.

The aforementioned timing controller and the power supply portion may be located at or included in the circuit board 430, and the data carrier 422 includes input wirings for transmitting various signals applied from the timing controller and the power supply portion to the data driving ICs 421 and output wirings for transmitting image data signals output from the data driving ICs 421 to respective corresponding ones of the data lines. In an exemplary embodiment, at least one of the data carrier 422 may further include auxiliary wirings for transmitting various signals applied from the timing controller and the power supply portion to the gate driver 410, and the auxiliary wirings are connected to panel wirings located at the lower panel 100. The panel wirings connect the auxiliary wirings and the gate driver 410 to each other. The panel wirings may be disposed on the non-display area NDA of the lower substrate 110 in a line-on-glass manner.

In an exemplary embodiment, as illustrated in FIG. 4, the upper panel 200 includes an upper substrate 210 and a common electrode CE disposed on the upper substrate 210.

The common electrode CE of the upper panel 200 is connected to a common line (not illustrated) of the lower panel 100 through a short portion (not illustrated). The common electrode CE receives a common voltage from the common line through the short portion.

The display panel includes a plurality of pixels R, G and B as illustrated in FIGS. 1 and 2. The plurality of pixels R, G and B are disposed in the display area DA of the display panel.

In an exemplary embodiment, as shown in FIG. 2A, the pixels R, G and B are arranged in the form of a matrix. The pixels R, G and B are classified into a red pixel R that displays a red image, a green pixel G that displays a green image and a blue pixel B that displays a blue image. In such an embodiment, a red pixel R, a green pixel G and a blue pixel B that are adjacently disposed in a horizontal direction may define a unit pixel for displaying a color image.

There are "j" number of pixels arranged along an n-th horizontal line (hereinafter, n-th horizontal line pixels), which are connected to the first to j-th data lines DL1 to DLj, respectively, where n is one selected from 1 to i. Further, pixels in an n-th horizontal line HLn (also referred to as n-th horizontal line pixels) are connected in common to an n-th gate line. Accordingly, the n-th horizontal line pixels receive an n-th gate signal as a common signal. That is, "j" number of pixels in a same horizontal line all receive a same gate signal, while pixels in different horizontal lines receive different gate signals, respectively. In one exemplary embodiment, for example, a red pixel R, a blue pixel B and a green pixel G in a first horizontal line HL1 all receive a first gate signal, while a red pixel R, a blue pixel B and a green pixel G in a second horizontal line HL2 all receive a second gate signal which has a different gate-on timing from a gate-on timing of the first gate signal.

In an exemplary embodiment, as illustrated in FIG. 2B, each of the pixels R, G and B includes a thin film transistor ("TFT"), a liquid crystal capacitor Clc and a storage capacitor Cst.

The TFT is turned on in response to a turn-on voltage of the gate signal applied from the gate line GLi. The turned-on TFT applies the analog image signal applied from the data line DLj to the liquid crystal capacitor Clc and the storage capacitor Cst.

In an exemplary embodiment, as illustrated in FIG. 4, The liquid crystal capacitor Clc includes a pixel electrode PE and a common electrode CE which oppose each other.

The storage capacitor Cst includes a pixel electrode PE and an opposing electrode which oppose each other. In an exemplary embodiment, the opposing electrode may be a previous gate line GLi−1 or a transmission line (not illustrated) which transmits the common voltage.

In an exemplary embodiment, as illustrated in FIGS. 3 and 4, the lower panel 100 includes the lower substrate 110, the gate line GL, the data line DL, the TFT, a gate insulating layer 120, a protection layer 140, a color filter CF, an insulating interlayer 160, the pixel electrode PE and a light blocking portion 170.

The TFT includes a gate electrode GE, a semiconductor layer SM, a source electrode SE and a drain electrode DE.

The gate line GL and the gate electrode GE are disposed on the lower substrate 110. A contact portion (e.g., an end portion) of the gate line GL may have a larger planar area than a planar area of another portion of the gate line GL for connection to another layer or an external driving circuit. At least one of the gate line GL and the gate electrode GE may include or be formed of aluminum (Al) or alloys thereof, silver (Ag) or alloys thereof, copper (Cu) or alloys thereof, and/or molybdenum (Mo) or alloys thereof. Alternatively, at least one of the gate line GL and the gate electrode GE may include or be formed of chromium (Cr), tantalum (Ta), titanium (Ti) or a combination thereof. In such an embodiment, at least one of the gate line GL and the gate electrode GE may have a multilayer structure including at least two conductive layers that have different physical properties from each other.

The gate insulating layer 120 is disposed on the gate line GL and the gate electrode GE. In an exemplary embodiment, the gate insulating layer 120 may be disposed over an entire surface of the lower substrate 110 including the gate line GL and the gate electrode GE. The gate insulating layer 120 may include or be formed of silicon nitride (SiNx) or silicon oxide (SiOx). The gate insulating layer 120 may have a multilayer structure including at least two insulating layers having different physical properties from each other.

The semiconductor layer SM is disposed on the gate insulating layer 120. In an exemplary embodiment, the semiconductor layer SM overlaps the gate electrode GE. The semiconductor layer SM may include amorphous silicon, polycrystalline silicon, or the like.

Although not illustrated, an ohmic contact layer may be disposed on the semiconductor layer SM. The ohmic contact layer may include silicide or n+ hydrogenated amorphous silicon doped with n-type impurities, e.g., phosphorus (P), at high concentration. The ohmic contact layer may be disposed to correspond to the semiconductor layer SM to form a pair.

The source electrode SE is disposed on the semiconductor layer SM. The source electrode SE extends from the data line DL. In one exemplary embodiment, for example, as illustrated in FIG. 3, the source electrode SE has a shape protruding from the data line DL toward the gate electrode GE. The source electrode SE overlaps the semiconductor layer SM and the gate electrode GE. The source electrode SE may include or be formed of a refractory metal, e.g., molybdenum, chromium, tantalum and titanium, and/or an alloy thereof. The source electrode SE may have a multi-layer structure including a refractory metal layer and a low-resistance conductive layer. In such an embodiment, the multilayer structure may include: a double-layer structure including a chromium or molybdenum (alloy) lower layer and an aluminum (alloy) upper layer; or a triple-layer structure including a molybdenum (alloy) lower layer, an aluminum (alloy) intermediate layer and a molybdenum (alloy) upper layer, for example. In an exemplary embodiment, the source electrode SE may include or be formed of any suitable metals and/or conductors other than the aforementioned materials.

In an exemplary embodiment, the drain electrode DE is disposed on the semiconductor layer SM and spaced apart from the source electrode SE. The drain electrode DE overlaps the gate electrode GE and the semiconductor layer SM. The drain electrode DE is connected to the pixel electrode PE. In an exemplary embodiment, the drain electrode DE may include a substantially same material and have a substantially same structure (a multilayer structure) as those of the source electrode SE. In such an embodiment, the drain electrode DE and the source electrode SE may be formed substantially simultaneously in a substantially same process.

The gate electrode GE, the source electrode SE and the drain electrode DE, together with the semiconductor layer SM, define a TFT. In an exemplary embodiment, a channel of the TFT is formed or located at a portion of the semiconductor layer SM between the source electrode SE and the drain electrode DE. Although not illustrated, the portion of the semiconductor layer SM corresponding to the channel may have a thickness less than a thickness of another portion of the semiconductor layer SM.

The data line DL is disposed on the gate insulating layer 120. Although not illustrated, a contact portion (e.g., an end portion) of the data line DL may have a planar area larger than a planar area of another portion of the data line DL for connection to another layer or an external driving circuit. The data line DL crosses the gate line GL. In an exemplary embodiment, although not illustrated, a portion of the data line DL crossing the gate line GL may have a line width less than a line width of another portion of the data line DL. Accordingly, in such an embodiment, a parasitic capacitance between the data line DL and the gate line GL may be reduced. In an exemplary embodiment, the data line DL may include a substantially same material and have a substantially same structure (a multilayer structure) as those of the source electrode SE. In such an embodiment, the data line DL and the source electrode SE may be formed substantially simultaneously in a substantially same process.

The protection layer 140 is disposed on the data line DL, the source electrode SE, the drain electrode DE and the gate insulating layer 120. In an exemplary embodiment, the protection layer 140 may be disposed over an entire surface of the lower substrate 110 including the data line DL, the source electrode SE, the drain electrode DE and the gate insulating layer 120. A contact hole CNT exposing the drain electrode DE is defined through the protection layer 140. In an exemplary embodiment, the protection layer 140 may include an inorganic insulating material, e.g., silicon nitride ($SiN_x$) or silicon oxide ($SiO_x$). In such an embodiment, the inorganic insulating material may have photosensitivity and a dielectric constant of about 4.0. In an alternative exemplary embodiment, the protection layer 140 may have a double-layer structure including a lower inorganic layer and an upper organic layer. In such an embodiment, the protection layer 140 has high insulating characteristics and effectively prevents an exposed portion of the semiconductor layer SM from being damaged. The protection layer 140 may have a thickness greater than or equal to about 5000 angstroms (Å), e.g., in a range from about 6000 Å to about 8000 Å.

The color filter CF is disposed on the protection layer 140. An edge of the color filter CF may be disposed to overlap the gate line GL, the TFT, and the data line DL. In an exemplary embodiment, an edge of one color filter CF may overlap an edge of another color filter adjacent thereto. The color filter CF may include a photosensitive organic material. The color filter CF may include a red color filter, a green color filter and a blue color filter.

The insulating interlayer 160 is disposed on the color filter CF and the protection layer 140. In an exemplary embodiment, the insulating interlayer 160 may be disposed over an entire surface of the lower substrate 110 including the color filter CF and the protection layer 140. The insulating interlayer 160 may include an organic material.

The pixel electrode PE is connected to the drain electrode DE through the contact hole CNT. The pixel electrode PE is disposed on the insulating interlayer 160. In an exemplary embodiment, the pixel electrode PE may include a transparent conductive material, e.g., indium tin oxide ("ITO") or indium zinc oxide ("IZO"). In such an embodiment, for example, ITO may include a polycrystalline material or a monocrystalline material, and/or IZO may also include a polycrystalline material or a monocrystalline material.

The light blocking portion 170 is disposed on the pixel electrode PE and the insulating interlayer 160. In one exemplary embodiment, for example, the light blocking portion 170 overlaps the TFT, the gate lines GL, and the data line DL to block light leakage.

A column spacer 171 may be disposed on the light blocking portion 170. The column spacer 171 may have a shape protruding to have a predetermined height from the light blocking portion 170 toward the upper substrate 210. The column spacer 171 maintains a cell gap between the lower substrate 110 and the upper substrate 210.

In an exemplary embodiment, the column spacer 171 may be integrally formed with the light blocking portion 170 as a single unitary and indivisible unit. In such an embodiment, the column spacer 171 and the light blocking portion 170 may be substantially simultaneously manufactured using a substantially same material. Such a structure of the column spacer 171 and the light blocking portion 170 may be also referred to as a black column spacer ("BCS").

Although not illustrated, a lower alignment layer may be disposed on the pixel electrode PE, the insulating interlayer 160, the light blocking portion 170 and the column spacer 171. The lower alignment layer may be a vertical alignment layer or a photo-alignment layer including a photo-polymerizable material.

The upper panel 200 includes the upper substrate 210 and the common electrode CE located on the upper substrate 210.

The common electrode CE may be disposed over an entire surface of the upper substrate 210. In an exemplary embodiment, the common electrode CE may include a transparent conductive material, e.g., ITO or IZO. In such an embodiment, for example, ITO may include a polycrystalline material or a monocrystalline material and/or IZO may also include a polycrystalline material or a monocrystalline material.

Although not illustrated, an upper alignment layer may be disposed on the common electrode CE. The upper alignment layer may be a vertical alignment layer or a photo-alignment layer including a photo-polymerizable material.

Figure 5:
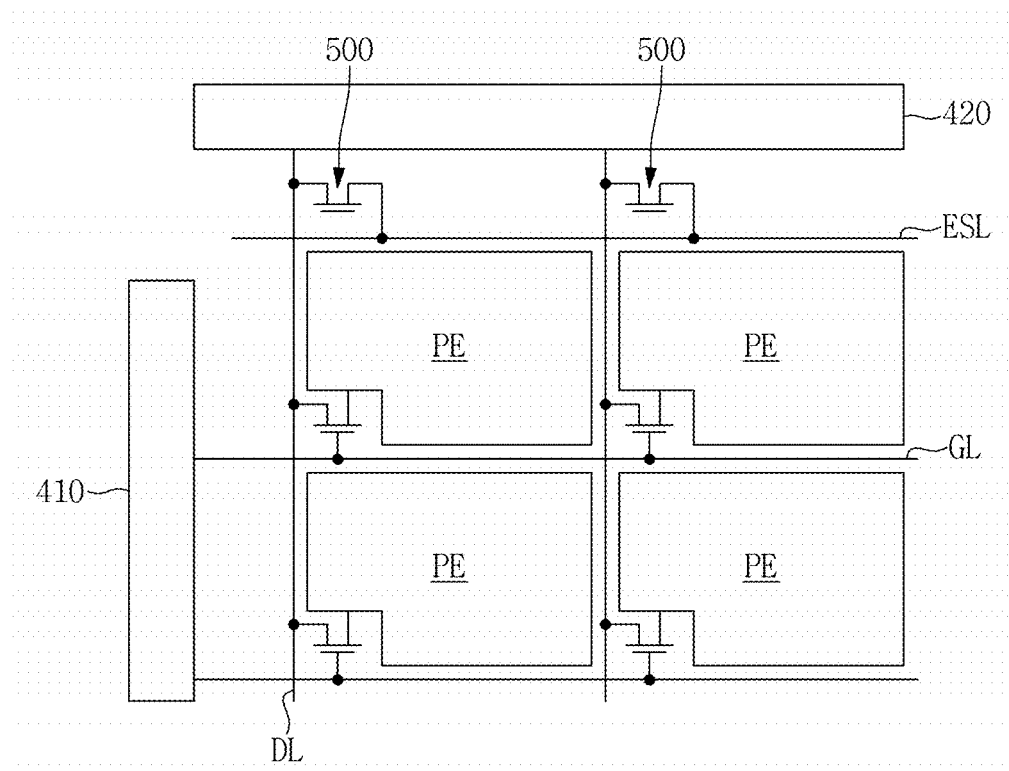
FIG. 5 is a circuit diagram illustrating a connection relationship between a gate driver, a data driver, a pixel, an electrostatic dispersion line, and an antistatic element according to an exemplary embodiment.
Figure 6A:
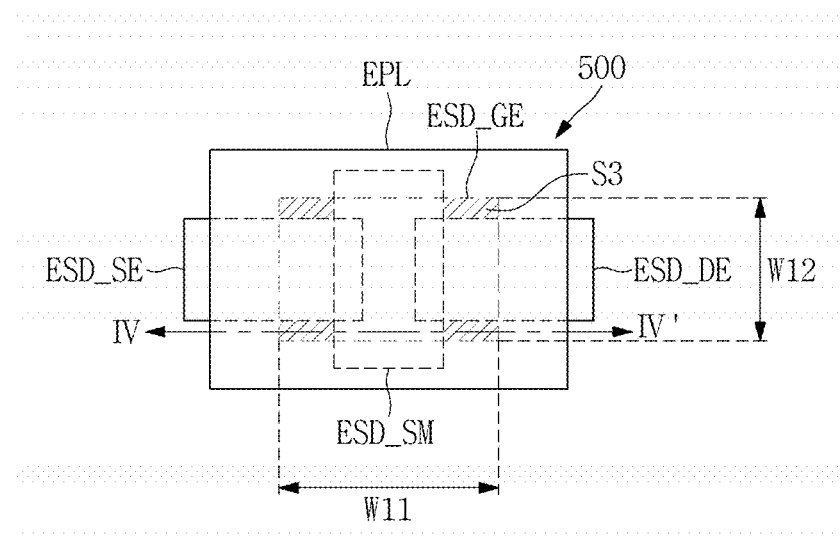
FIG. 6A is a plan view illustrating an antistatic element according to an exemplary embodiment.
Figure 6B:
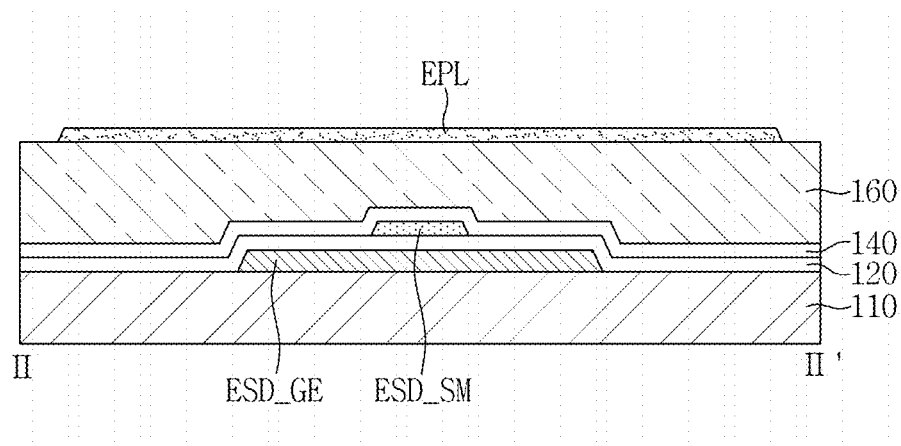
FIG. 6B is a cross-sectional view taken along line II-II' of FIG. 6A.

FIG. 5 is a circuit diagram illustrating a connection relationship between a gate driver, a data driver, a pixel, an electrostatic dispersion line, and an antistatic element according to an exemplary embodiment, FIG. 6A is a plan view illustrating an antistatic element according to an exemplary embodiment, and FIG. 6B is a cross-sectional view taken along line II-II' of FIG. 6A.

Hereinafter, an electrostatic dispersion line ESL and an antistatic element 500 of an exemplary embodiment of a display panel will be described in detail with reference to FIGS. 5, 6A and 6B.

In an exemplary embodiment, the electrostatic dispersion line ESL is disposed on the non-display area NDA of the lower substrate 110 and is connected to the antistatic element 500. In one exemplary embodiment, for example, as illustrated in FIG. 1, the electrostatic dispersion line ESL may extend along the first direction D1 in parallel with the gate lines GL1 to GLi. However, exemplary embodiments are not limited thereto, and alternatively, the electrostatic dispersion line ESL may extend in the first direction D1 and the second direction D2 in a shape surrounding the display area DA, and/or may include a plurality of lines each extending in the first direction D1 and the second direction D2.

The electrostatic dispersion line ESL may include a conductive material. In one exemplary embodiment, for example, the electrostatic dispersion line ESL may include a substantially same material and may have a substantially same structure as those of the gate electrode GE described above. In such an embodiment, the electrostatic dispersion line ESL and the gate electrode GE may be formed substantially simultaneously in a substantially same process. However, exemplary embodiments are not limited thereto, and alternatively, the electrostatic dispersion line ESL may include a substantially same material and may have a substantially same structure as those of the source electrode SE and the drain electrode DE described above.

Although not illustrated, the electrostatic dispersion line ESL may be connected to a ground potential. Alternatively, the electrostatic dispersion line ESL may be connected to a separate wiring to which a constant voltage is applied. Accordingly, a static electricity introduced into the gate line GL or the data line DL may be dispersed through the electrostatic dispersion line ESL.

In an exemplary embodiment, as illustrated in FIGS. 6A and 6B, the antistatic element 500 includes a discharge gate electrode ESD_GE, a discharge semiconductor layer ESD_SM, a discharge source electrode ESD_SE, and a discharge drain electrode ESD_DE.

The discharge gate electrode ESD_GE is disposed on the lower substrate 110. In an exemplary embodiment, the discharge gate electrode ESD_GE may include a substantially same material and have a substantially same structure (a multilayer structure) as those of the gate electrode GE described above. In such an embodiment, the discharge gate electrode ESD_GE and the gate electrode GE may be formed substantially simultaneously in a substantially same process.

According to an exemplary embodiment, the discharge gate electrode ESD_GE is not connected to another wiring such as the gate line GL, the data line DL and the electrostatic dispersion line ESL, thus being floated.

In such an embodiment, the discharge gate electrode ESD_GE has a first width W11, which is a width in a longitudinal direction on a plane, and a second width W12, which is a width in a direction crossing the longitudinal direction, as illustrated in FIG. 6A.

The discharge semiconductor layer ESD_SM is disposed on the gate insulating layer 120. In an exemplary embodiment, the discharge semiconductor layer ESD_SM may include a substantially same material and have a substantially same structure (a multilayer structure) as those of the semiconductor layer SM described above. In such an embodiment, the discharge semiconductor layer ESD_SM and the semiconductor layer SM may be formed substantially simultaneously in a substantially same process.

According to an exemplary embodiment, one of the discharge source electrode ESD_SE and the discharge drain electrode ESD_DE may be connected to the data line DL and the other of the discharge source electrode ESD_SE and the discharge drain electrode ESD_DE may be connected to the electrostatic dispersion line ESL. In one exemplary embodiment, for example, as illustrated in FIG. 5, the discharge source electrode ESD_SE may be connected to the data line DL, and the discharge drain electrode ESD_DE may be connected to the electrostatic dispersion line ESL.

The discharge source electrode ESD_SE and the discharge drain electrode ESD_DE are spaced apart from each other on the discharge semiconductor layer ESD_SM. The discharge source electrode ESD_SE and the discharge drain electrode ESD_DE are spaced apart from the discharge gate electrode ESD_GE with the gate insulating layer 120 and the discharge semiconductor layer ESD_SM interposed therebetween. In an exemplary embodiment, the discharge source electrode ESD_SE and the discharge drain electrode ESD_DE may include a substantially same material and have a substantially same structure (a multilayer structure) as those of the source electrode SE and the drain electrode DE described above. In such an embodiment, the discharge source electrode ESD_SE, the discharge drain electrode ESD_DE, the source electrode SE and the drain electrode DE may be formed substantially simultaneously in a substantially same process.

According to an exemplary embodiment, the discharge gate electrode ESD_GE includes an area S3 which does not overlap any one of the discharge semiconductor layer ESD_SM, the discharge source electrode ESD_SE, and the discharge drain electrode ESD_DE. Accordingly, the discharge gate electrode ESD_GE may be influenced by an external electric field.

In an exemplary embodiment, the display device includes an electric field protection layer EPL to prevent the discharge gate electrode ESD_GE from being influenced by an external electric field.

The electric field protection layer EPL is disposed on the insulating interlayer 160. In an exemplary embodiment, the electric field protection layer EPL may include a substantially same material and have a substantially same structure (a multilayer structure) as those of the pixel electrode PE described above. In such an embodiment, the electric field protection layer EPL and the pixel electrode PE may be formed substantially simultaneously in a substantially same process. However, exemplary embodiments are not limited thereto, and alternatively, the electric field protection layer EPL may include a conductive material different from a material included in the pixel electrode.

The electric field protection layer EPL covers the discharge gate electrode ESD_GE and may have a planar area larger than a planar area of the discharge gate electrode ESD_GE. In one exemplary embodiment, for example, the electric field protection layer EPL covers an area of the discharge gate electrode ESD_GE which does not overlap any one of the discharge semiconductor layer ESD_SM, the discharge source electrode ESD_SE, and the discharge drain electrode ESD_DE. In such an embodiment, although not illustrated, the electric field protection layer EPL may be connected to a ground potential or a wiring to which a constant electric potential is applied. In one exemplary embodiment, for example, the electric field protection layer EPL may be connected to the electrostatic dispersion line ESL such that an electric potential substantially equal to an electric potential of the electrostatic dispersion line may be applied to the electric field protection layer EPL.

The electric field protection layer EPL may effectively prevent an electric potential from being induced in the antistatic element 500 by an external electric field. Accordingly, the electric field protection layer EPL may effectively prevent the antistatic element 500 from being affected by the external electric field.

Figure 7A:
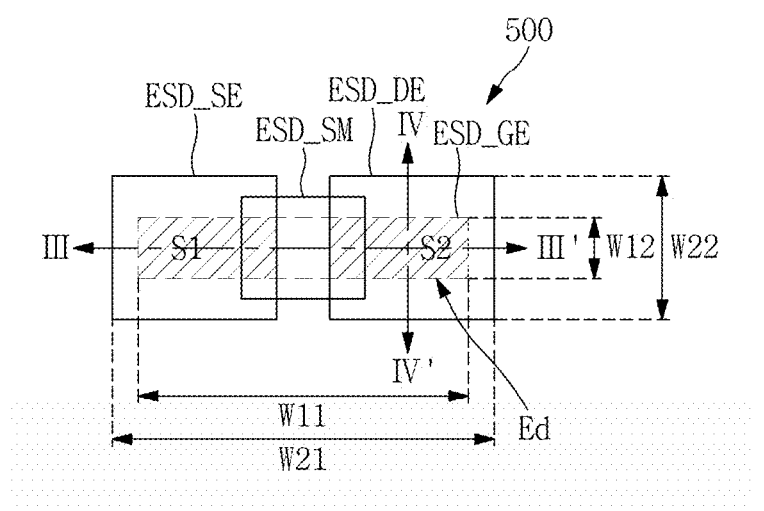
FIG. 7A is a plan view illustrating an antistatic element according to an alternative exemplary embodiment.
Figure 7B:
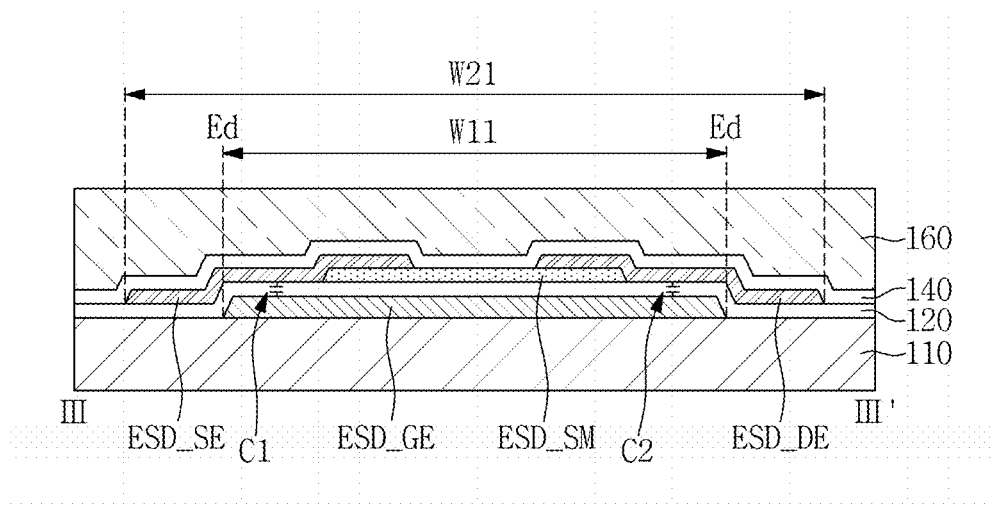
FIG. 7B is a cross-sectional view taken along line III-III' of FIG. 7A.
Figure 7C:
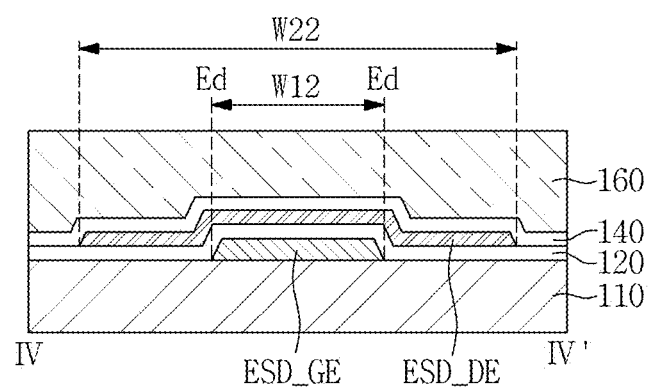
FIG. 7C is a cross-sectional view taken along line IV-IV' of FIG. 7A.

FIG. 7A is a plan view illustrating an antistatic element according to an alternative exemplary embodiment, FIG. 7B is a cross-sectional view taken along line III-III' of FIG. 7A, and FIG. 7C is a cross-sectional view taken along line IV-IV' of FIG. 7A.

Hereinafter, an alternative exemplary embodiment of an antistatic element will be described in detail with reference to FIGS. 7A, 7B and 7C.

In such an embodiment, a discharge gate electrode ESD_GE is disposed on a lower substrate 110. In an exemplary embodiment, the discharge gate electrode ESD_GE may include a substantially same material and have a substantially same structure (a multilayer structure) as those of the gate electrode GE described above. In such an embodiment, the discharge gate electrode ESD_GE and the gate electrode GE may be formed substantially simultaneously in a substantially same process.

The discharge gate electrode ESD_GE is not connected to another wiring such as a gate line GL, a data line DL and an electrostatic dispersion line ESL, thus being floated.

A discharge semiconductor layer ESD_SM is disposed on a gate insulating layer 120. In an exemplary embodiment, the discharge semiconductor layer ESD_SM may include a substantially same material and have a substantially same structure (a multilayer structure) as those of a semiconductor layer SM described above. In such an embodiment, the discharge semiconductor layer ESD_SM and the semiconductor layer SM may be formed substantially simultaneously in a substantially same process.

A discharge source electrode ESD_SE and a discharge drain electrode ESD_DE are spaced apart from each other on the discharge semiconductor layer ESD_SM. The discharge source electrode ESD_SE and the discharge drain electrode ESD_DE are spaced apart from the discharge gate electrode ESD_GE with the gate insulating layer 120 and the discharge semiconductor layer ESD_SM interposed therebetween. In an exemplary embodiment, the discharge source electrode ESD_SE and the discharge drain electrode ESD_DE may include a substantially same material and have a substantially same structure (a multilayer structure) as those of the source electrode SE and the drain electrode DE described above. In such an embodiment, the discharge source electrode ESD_SE, the discharge drain electrode ESD_DE, the source electrode SE and the drain electrode DE may be formed substantially simultaneously in a substantially same process.

In an exemplary embodiment, the discharge source electrode ESD_SE and the discharge gate electrode ESD_GE at least partially overlap each other at an overlapping area (or overlapping region) S1. A first capacitor C1 is defined by the overlapping area S1 of the discharge source electrode ESD_SE and the discharge gate electrode ESD_GE. Herein, the term "overlapping area" or "overlapping parts" of two elements is defined as parts or portions of the two elements overlapping each other. In such an embodiment, the discharge drain electrode ESD_DE and the discharge gate electrode ESD_GE at least partially overlap each other at an overlapping area S2 thereof. A second capacitor C2 is defined by the overlapping area S2 of the discharge drain electrode ESD_DE and the discharge gate electrode ESD_GE.

According to an exemplary embodiment, the overlapping area S1 of the discharge source electrode ESD_SE and the discharge gate electrode ESD_GE may have a planar area different from a planar area of the overlapping area S2 of the discharge drain electrode ESD_DE and the discharge gate electrode ESD_GE. In such an embodiment, the first capacitor C1 may have a capacitance value different from a capacitance value of the second capacitor C2. However, exemplary embodiments are not limited thereto. In an alternative exemplary embodiment, the overlapping area S1 of the discharge source electrode ESD_SE and the discharge gate electrode ESD_GE may have a planar area substantially equal to a planar area of the overlapping area S2 of the discharge drain electrode ESD_DE and the discharge gate electrode ESD_GE, and the first capacitor C1 may have a capacitance value substantially equal to a capacitance value of the second capacitor C2.

In such an embodiment, the discharge gate electrode ESD_GE of the antistatic element 500 may be floated in an island shape, and the first and second capacitors C1 and C2 are formed by the overlapping areas S1 and S2 at which the discharge gate electrode ESD_GE overlaps the discharge source electrode ESD_SE and the discharge drain electrode ESD_DE, respectively. Accordingly, the antistatic element 500 may disperse a static electricity introduced into the gate line GL, the data line DL and the electrostatic dispersion line ESL in two opposite directions of the antistatic element 500, such that damages to a display element due to the static electricity is effective prevented.

Referring to FIG. 7A, when one side ends of the discharge source electrode ESD_SE and the discharge drain electrode ESD_DE facing each other on a plane are respectively referred to as inner side ends of the discharge source electrode ESD_SE and the discharge drain electrode ESD_DE, and another side ends of the discharge source electrode ESD_SE and the discharge drain electrode ESD_DE facing the inner side ends are respectively referred to as outer side ends of the discharge source electrode ESD_SE and the discharge drain electrode ESD_DE, a distance between the outer side end of the discharge source electrode ESD_SE and the outer side end of the discharge drain electrode ESD_DE is defined as a first width W21. In addition, the discharge source electrode ESD_SE and the discharge drain electrode ESD_DE have a second width W22 which is a distance between other two side ends of the discharge source electrode ESD_SE and the discharge drain electrode ESD_DE except the inner side ends and the outer side ends of the discharge source electrode ESD_SE and the discharge drain electrode ESD_DE.

In such an embodiment, the discharge gate electrode ESD_GE has a width less than a width of the discharge source electrode ESD_SE and the discharge drain electrode ESD_DE. In one exemplary embodiment, for example, a first width W11 of the discharge gate electrode ESD_GE is less than the first width W21 of the discharge source electrode ESD_SE and the discharge drain electrode ESD_DE (W11<W21). In addition, a second width W12 of the discharge gate electrode ESD_GE is less than the second width W22 of the discharge source electrode ESD_SE and the discharge drain electrode ESD_DE (W12<W22).

In such an embodiment, the discharge gate electrode ESD_GE has an edge Ed at which the discharge gate electrode ESD_GE overlaps the gate insulating layer 120. In such an embodiment, as illustrated in FIG. 7B, the edge Ed of the discharge gate electrode ESD_GE overlaps the discharge semiconductor layer ESD_SM, the discharge source electrode ESD_SE, and the discharge drain electrode ESD_DE.

Accordingly, in such an embodiment, no portion of the discharge gate electrode ESD_GE does not overlap any one of the discharge semiconductor layer ESD_SM, the discharge source electrode ESD_SE and the discharge drain electrode ESD_DE. In such an embodiment, an entire area of the discharge gate electrode overlaps at least one of the discharge semiconductor layer, the discharge source electrode, and the discharge drain electrode when viewed from a plan view. Accordingly, the discharge gate electrode ESD_GE may effectively prevent the antistatic element 500 from being affected by an external electric field.

Figure 8A:
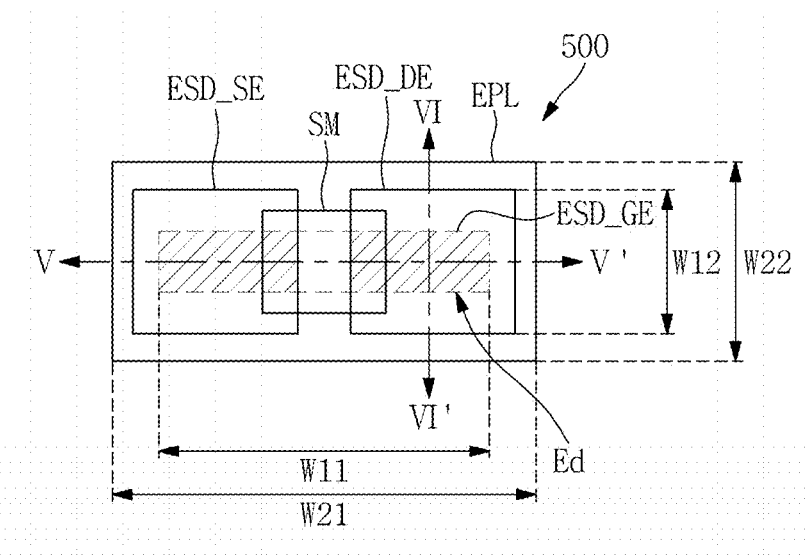
FIG. 8A is a plan view illustrating an antistatic element according to another alternative exemplary embodiment.
Figure 8B:
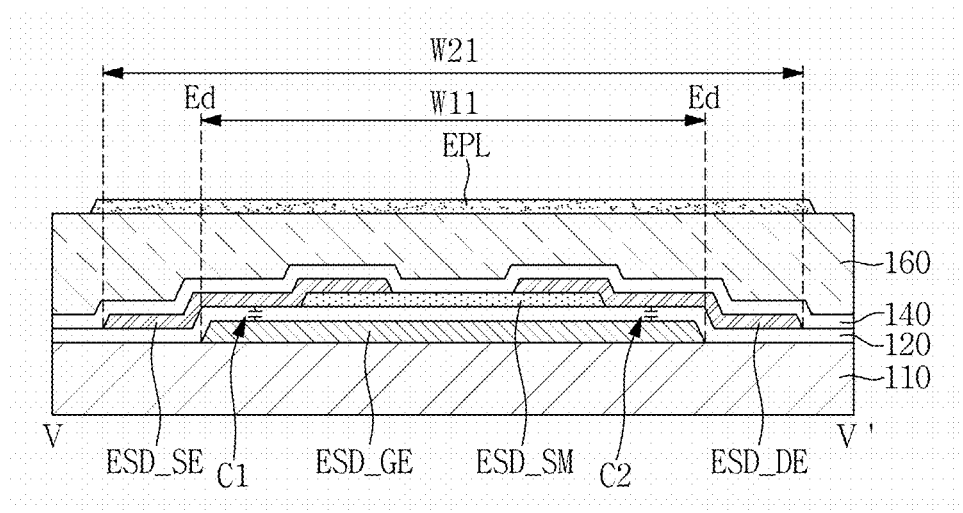
FIG. 8B is a cross-sectional view taken along line V-V' of FIG. 8A.
Figure 8C:
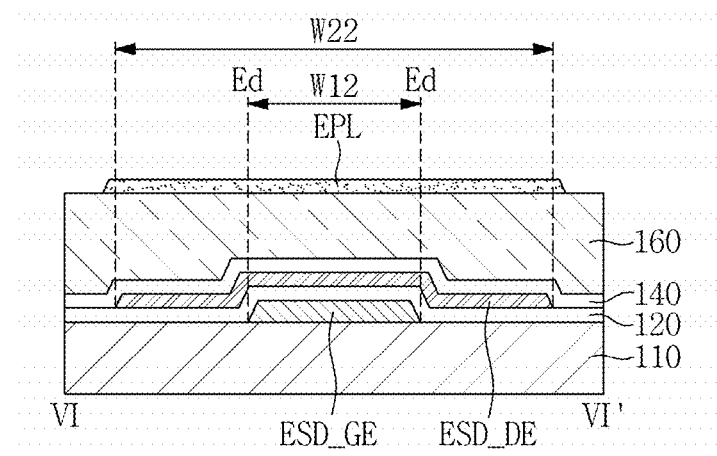
FIG. 8C is a cross-sectional view taken along line VI-VI' of FIG. 8A.

FIG. 8A is a plan view illustrating an antistatic element according to another alternative exemplary embodiment, FIG. 8B is a cross-sectional view taken along line V-V' of FIG. 8A, and FIG. 8C is a cross-sectional view taken along line VI-VI' of FIG. 8A.

Hereinafter, an antistatic element according to another alternative exemplary embodiment will be described in detail with reference to FIGS. 8A, 8B and 8C.

Referring to FIG. 8A, when one side ends of a discharge source electrode ESD_SE and a discharge drain electrode ESD_DE facing each other on a plane are respectively referred to as inner side ends of the discharge source electrode ESD_SE and the discharge drain electrode ESD_DE, and another side ends of the discharge source electrode ESD_SE and the discharge drain electrode ESD_DE facing the inner side ends are respectively referred to as outer side ends of the discharge source electrode ESD_SE and the discharge drain electrode ESD_DE, a distance between the outer side end of the discharge source electrode ESD_SE and the outer side end of the discharge drain electrode ESD_DE is defined as a first width W21. In addition, the discharge source electrode ESD_SE and the discharge drain electrode ESD_DE have a second width W22 which is a distance between other two side ends of the discharge source electrode ESD_SE and the discharge drain electrode ESD_DE except the inner side ends and the outer side ends of the discharge source electrode ESD_SE and the discharge drain electrode ESD_DE.

In such an embodiment, a discharge gate electrode ESD_GE has a width less than a width of the discharge source electrode ESD_SE and the discharge drain electrode ESD_DE. In one exemplary embodiment, for example, a first width W11 of the discharge gate electrode ESD_GE is less than the first width W21 of the discharge source electrode ESD_SE and the discharge drain electrode ESD_DE (W11<W21). In addition, a second width W12 of the discharge gate electrode ESD_GE is less than the second width W22 of the discharge source electrode ESD_SE and the discharge drain electrode ESD_DE (W12<W22).

In an exemplary embodiment, the discharge gate electrode ESD_GE has an edge Ed at which the discharge gate electrode ESD_GE overlaps the gate insulating layer 120. In such an embodiment, as illustrated in FIG. 8B, the edge Ed of the discharge gate electrode ESD_GE overlaps the discharge semiconductor layer ESD_SM, the discharge source electrode ESD_SE and the discharge drain electrode ESD_DE.

Accordingly, in such an embodiment, no portion of the discharge gate electrode ESD_GE does not overlap any one of the discharge semiconductor layer ESD_SM, the discharge source electrode ESD_SE and the discharge drain electrode ESD_DE. In such an embodiment, an entire area of the discharge gate electrode overlaps at least one of the discharge semiconductor layer, the discharge source electrode and the discharge drain electrode on a plane.

According to an exemplary embodiment, the display device further includes an electric field protection layer EPL.

The electric field protection layer EPL covers the discharge gate electrode ESD_GE and may have a planar area larger than a planar area of the discharge gate electrode ESD_GE. In such an embodiment, although not illustrated, the electric field protection layer EPL may be connected to a ground potential or a wiring to which a constant electric potential is applied. In one exemplary embodiment, for example, the electric field protection layer EPL may be connected to an electrostatic dispersion line ESL so that an electric potential substantially equal to that of the electrostatic dispersion line ESL may be applied to the electric field protection layer EPL.

The electric field protection layer EPL may effectively prevent electric potential from being induced in the antistatic element 500 by an external electric field. Accordingly, the electric field protection layer EPL may substantially minimize the influence of the external electric field on the antistatic element 500, and the stability of the display device may be improved.

Figure 9:
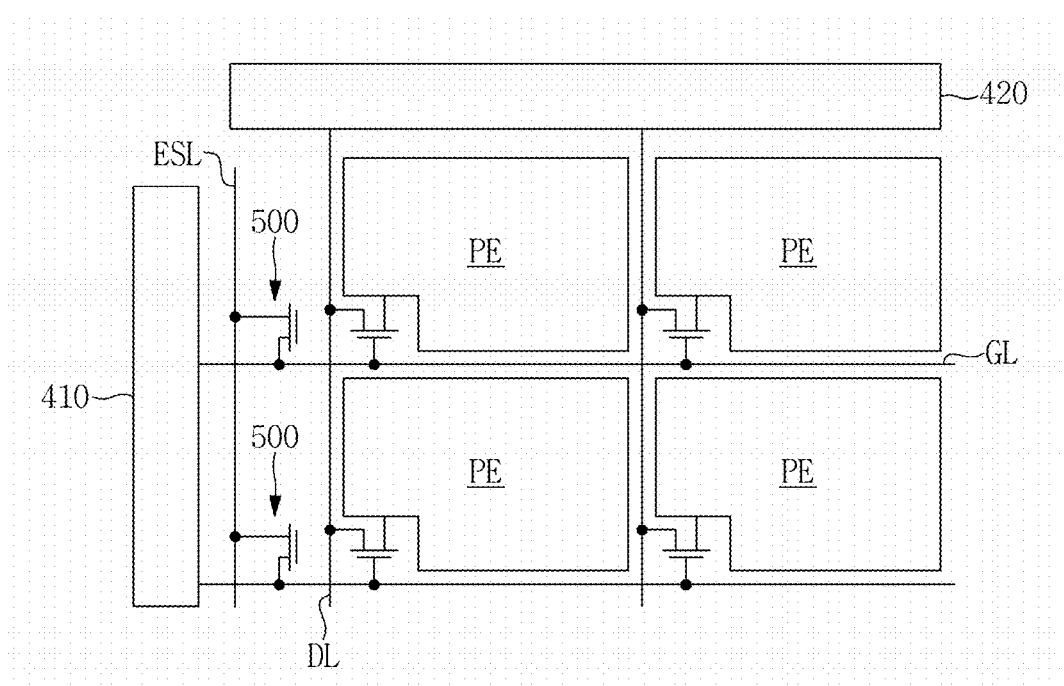
FIG. 9 is a circuit diagram illustrating a connection relationship between a gate driver, a data driver, a pixel, an electrostatic dispersion line, and an antistatic element according to an alternative exemplary embodiment.

FIG. 9 is a circuit diagram illustrating a connection relationship between a gate driver, a data driver, a pixel, an electrostatic dispersion line, and an antistatic element according to an alternative exemplary embodiment.

Hereinafter, an alternative exemplary embodiment will be described in detail with reference to FIG. 9.

According to an exemplary embodiment, one of a discharge source electrode ESD_SE and a discharge drain electrode ESD_DE may be connected to a gate line GL and the other of the discharge source electrode ESD_SE and the discharge drain electrode ESD_DE may be connected to an electrostatic dispersion line ESL. In one exemplary embodiment, for example, as illustrated in FIG. 9, the discharge source electrode ESD_SE may be connected to the gate line GL, and the discharge drain electrode ESD_DE may be connected to the electrostatic dispersion line ESL.

Figure 10:
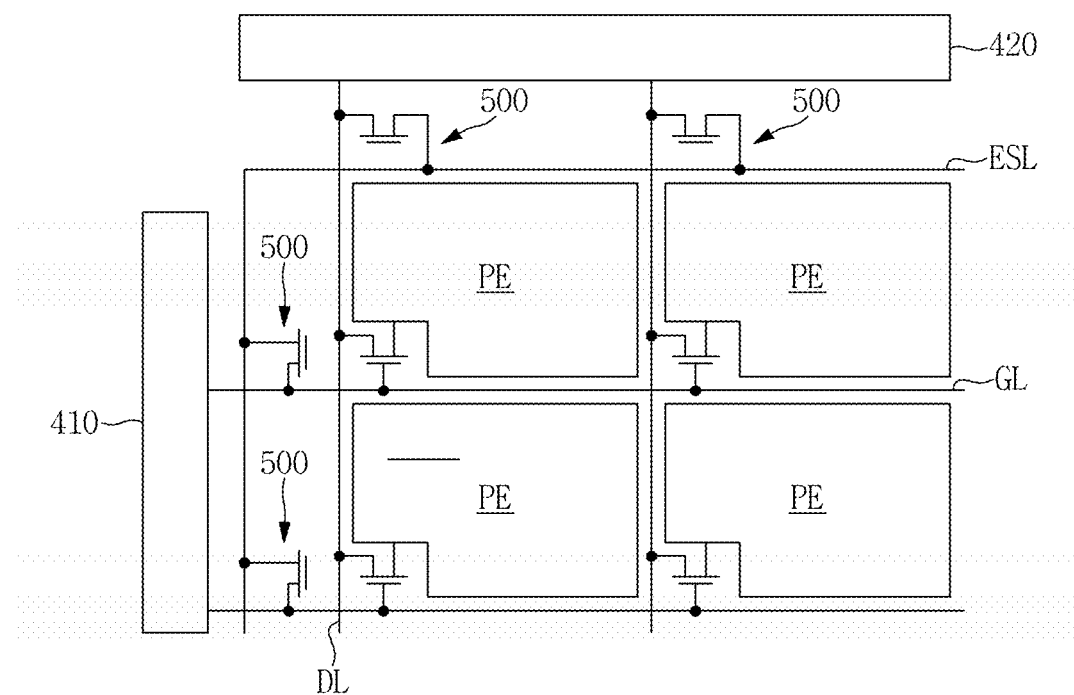
FIG. 10 is a circuit diagram illustrating a connection relationship between a gate driver, a data driver, a pixel, an electrostatic dispersion line, and an antistatic element according to another alternative exemplary embodiment.

FIG. 10 is a circuit diagram illustrating a connection relationship between a gate driver, a data driver, a pixel, an electrostatic dispersion line, and an antistatic element according to another alternative exemplary embodiment.

Hereinafter, another alternative exemplary embodiment will be described in detail with reference to FIG. 10.

According to another alternative exemplary embodiment, one of a discharge source electrode ESD_SE and a discharge drain electrode ESD_DE of one of a plurality of antistatic elements 500 may be connected to a data line DL, and the other of the discharge source electrode ESD_SE and the discharge drain electrode ESD_DE of the one of the plurality of antistatic elements 500 may be connected to an electrostatic dispersion line ESL. In such an embodiment, one of a discharge source electrode ESD_SE and a discharge drain electrode ESD_DE of another of the plurality of antistatic elements 500 may be connected to a gate line GL, and the other of the discharge source electrode ESD_SE and the discharge drain electrode ESD_DE of the another of the plurality of antistatic elements 500 may be connected to the electrostatic dispersion line ESL.

In exemplary embodiment of a display device according to the invention, as set forth hereinabove, a display element may be effectively prevented from being damaged due to static electricity, and effects of potential induction of an external electric field over an antistatic element may be substantially minimized.

While the invention has been illustrated and described with reference to the exemplary embodiments thereof, it will be apparent to those of ordinary skill in the art that various changes in form and detail may be formed thereto without departing from the spirit and scope of the invention.

What is claimed is:

1. A display device comprising:
    a first substrate comprising a display area and a non-display area;
    a gate line extending along a first direction on the first substrate;
    a data line extending along a second direction crossing the first direction on the first substrate;
    an electrostatic dispersion line on the non-display area of the first substrate;
    an antistatic element connected to the electrostatic dispersion line, wherein the antistatic element comprises:
        an discharge gate electrode;
        a discharge semiconductor layer on the discharge gate electrode, wherein the discharge semiconductor overlaps at least a portion of the discharge gate electrode on the discharge gate electrode;
        a discharge source electrode on the discharge semiconductor layer, wherein the discharge source electrode overlaps at least a portion of the discharge gate electrode; and
        a discharge drain electrode on the discharge semiconductor layer and spaced apart from the discharge source electrode, wherein the discharge drain electrode overlaps at least a portion of the discharge gate electrode; and
    an electric field protection layer on the antistatic element, wherein the electric field protection layer is connected to one of the electrostatic dispersion line, a ground wiring, and a wiring to which a constant electric potential is applied,
    wherein
    one of the discharge source electrode and the discharge drain electrode is connected to the electrostatic dispersion line,
    the other of the discharge source electrode and the discharge drain electrode is connected to one of the gate line and the data line, and
    the electric field protection layer has substantially the same electric potential as the one of the electrostatic dispersion line, the ground potential, and the wiring.

2. The display device as claimed in claim 1, wherein
    the electric field protection layer has a planar area larger than a planar area of the discharge gate electrode, and
    the electric field protection layer covers the discharge gate electrode.

3. The display device as claimed in claim 2, wherein the electric field protection layer comprises a conductive material.

4. The display device as claimed in claim 2, wherein the electrostatic dispersion line extends along the first direction or the second direction.

5. The display device as claimed in claim 4, wherein the electrostatic dispersion line has a closed loop shape surrounding the display area.

6. The display device as claimed in claim 1, wherein the discharge gate electrode has a width less than a width of the discharge source electrode and the discharge drain electrode.

7. The display device as claimed in claim 6, wherein an entire portion of the discharge gate electrode overlaps at least one of the discharge semiconductor layer, the discharge source electrode and the discharge drain electrode on a plane.

8. The display device as claimed in claim 6, wherein an overlapping area of the discharge gate electrode and the discharge source electrode and an overlapping area of the discharge gate electrode and the discharge drain electrode have different planar areas from each other.

9. The display device as claimed in claim 8, further comprising:
    a first capacitor defined by the overlapping area of the discharge gate electrode and the discharge source electrode; and
    a second capacitor defined by the overlapping area of the discharge gate electrode and the discharge drain electrode,
    wherein the first capacitor has a capacitance value different from a capacitance value of the second capacitor.

10. The display device as claimed in claim 6, wherein the discharge source electrode and the discharge drain electrode comprise a substantially same conductive material.

11. A display device comprising:
    a first substrate comprising a display area and a non-display area;
    a gate line extending along a first direction on the first substrate;
    a data line extending along a second direction crossing the first direction on the first substrate;
    an electrostatic dispersion line on the non-display area of the first substrate; and
    an antistatic element connected to the electrostatic dispersion line, wherein the antistatic element comprises:
        an discharge gate electrode;
        a discharge semiconductor layer on the discharge gate electrode, wherein the discharge semiconductor layer overlaps at least a portion of the discharge gate electrode on the discharge gate electrode;
        a discharge source electrode on the discharge semiconductor layer wherein the discharge source electrode overlaps at least a portion of the discharge gate electrode; and
        a discharge drain electrode on the discharge semiconductor layer and spaced apart from the discharge source electrode, wherein the discharge drain electrode overlaps at least a portion of the discharge gate electrode,
    wherein
    one of the discharge source electrode and the discharge drain electrode is connected to the electrostatic dispersion line,
    the other of the discharge source electrode and the discharge drain electrode is connected to one of the gate line and the data line, and
    the discharge gate electrode has a width less than a width of the discharge source electrode and the discharge drain electrode when viewed from a plan view in a width direction of the discharging semiconductor layer.

12. The display device as claimed in claim 11, wherein an entire portion of the discharge gate electrode overlaps at least one of the discharge semiconductor layer, the discharge source electrode and the discharge drain electrode on a plane.

13. The display device as claimed in claim 11, wherein the discharge source electrode and the discharge drain electrode comprise a substantially same conductive material.

14. The display device as claimed in claim 11, wherein an overlapping area of the discharge gate electrode and the discharge source electrode and an overlapping area of the discharge gate electrode and the discharge drain electrode have different planar areas from each other.

15. The display device as claimed in claim 14, further comprising:
   a first capacitor defined by the overlapping area of the discharge gate electrode and the discharge source electrode; and
   a second capacitor defined by the overlapping area of the discharge gate electrode and the discharge drain electrode,
   wherein the first capacitor has a capacitance value different from a capacitance value of the second capacitor.

16. The display device as claimed in claim 11, wherein the electrostatic dispersion line extends along the first direction or the second direction.

17. The display device as claimed in claim 16, wherein the electrostatic dispersion line has a closed loop shape surrounding the display area.

18. The display device as claimed in claim 16, wherein the antistatic element is provided in plural,
   one of the discharge source electrode and the discharge drain electrode of one of the antistatic elements is connected to the electrostatic dispersion line,
   the other of the discharge source electrode and the discharge drain electrode of the one of the antistatic elements is connected to the gate line, and
   one of the discharge source electrode and the discharge drain electrode of another of the antistatic elements is connected to the electrostatic dispersion line, and
   the other of the discharge source electrode and the discharge drain electrode of the another of the antistatic elements is connected to the data line.

19. The display device as claimed in claim 16, wherein the electrostatic dispersion line has an electric potential substantially equal to a ground potential.

* * * * *